(12) United States Patent
Wachter et al.

(10) Patent No.: US 9,099,454 B2
(45) Date of Patent: Aug. 4, 2015

(54) MOLDED SEMICONDUCTOR PACKAGE WITH BACKSIDE DIE METALLIZATION

(71) Applicant: Infineon Technologies AG, Neubiberg (DE)

(72) Inventors: Ulrich Wachter, Regenburg (DE); Veronika Huber, Bad Abbach (DE); Thomas Kilger, Regenstauf (DE); Ralf Otremba, Kaufbeuren (DE); Bernd Stadler, Donaustauf (DE); Dominic Maier, Pleystein (DE); Klaus Schiess, Allensbach (DE); Andreas Schlögl, Ottobrunn (DE); Uwe Wahl, München (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/964,153

(22) Filed: Aug. 12, 2013

(65) Prior Publication Data

US 2015/0041967 A1    Feb. 12, 2015

(51) Int. Cl.
*H01L 23/495* (2006.01)
*H01L 23/00* (2006.01)
(Continued)

(52) U.S. Cl.
CPC .......... *H01L 23/49575* (2013.01); *H01L 23/36* (2013.01); *H01L 23/49562* (2013.01); *H01L 24/24* (2013.01); *H01L 24/25* (2013.01); *H01L 24/49* (2013.01); *H01L 24/85* (2013.01); *H01L 21/568* (2013.01); *H01L 2224/04105* (2013.01); *H01L 2224/2518* (2013.01); *H01L 2224/32245* (2013.01); *H01L 2224/48247* (2013.01); *H01L 2224/73265* (2013.01); *H01L 2924/13055* (2013.01); *H01L 2924/13091* (2013.01); *H01L 2924/18162* (2013.01)

(58) Field of Classification Search
CPC ................. H01L 2224/32245; H01L 2224/11; H01L 21/568; H01L 23/49838
USPC ................................................... 257/712, 787
See application file for complete search history.

(56) References Cited

U.S. PATENT DOCUMENTS

| 6,404,041 | B1 | 6/2002 | Gantioler et al. |
| 7,936,048 | B2 | 5/2011 | Otremba |
| 8,039,315 | B2 * | 10/2011 | Lee et al. .................... 438/113 |

(Continued)

FOREIGN PATENT DOCUMENTS

| DE | 19806817 C1 | 2/1998 |
| DE | 102004021054 A1 | 11/2005 |

(Continued)

*Primary Examiner* — Roy Potter
(74) *Attorney, Agent, or Firm* — Murphy, Bilak & Homiller, PLLC

(57) ABSTRACT

A semiconductor package is manufactured by providing a semiconductor die with a terminal at a first side of the die, providing a material coupled to the die at an opposing second side of the die and embedding the die in a molding compound so that the die is covered by the molding compound on all sides except the first side. The molding compound is thinned at a side of the molding compound adjacent the second side of the die, to expose the material at the second side of the die without exposing the second side of the die. An electrical connection is formed to the terminal at the first side of the die. In the case of a transistor die, the terminal can be a source terminal and the transistor die can be attached source-down to a metal block such as a die paddle of a lead frame.

22 Claims, 12 Drawing Sheets

(51) Int. Cl.
*H01L 23/36* (2006.01)
*H01L 21/56* (2006.01)

(56) References Cited

U.S. PATENT DOCUMENTS

| | | | |
|---|---|---|---|
| 8,044,523 B2 | 10/2011 | Otremba | |
| 8,324,020 B2 | 12/2012 | Eichelberger et al. | |
| 8,324,718 B2 * | 12/2012 | Honda | 257/687 |
| 2009/0102002 A1 | 4/2009 | Chia et al. | |
| 2010/0078784 A1 | 4/2010 | Otremba | |
| 2014/0097536 A1 | 4/2014 | Schunk | |
| 2014/0264808 A1 | 9/2014 | Wolter et al. | |
| 2015/0028478 A1 | 1/2015 | Meyer et al. | |

FOREIGN PATENT DOCUMENTS

| | | |
|---|---|---|
| DE | 102004030042 A1 | 1/2006 |
| DE | 102006012739 B3 | 11/2007 |
| DE | 102009012524 A1 | 9/2009 |
| DE | 102006023123 B4 | 1/2011 |

\* cited by examiner

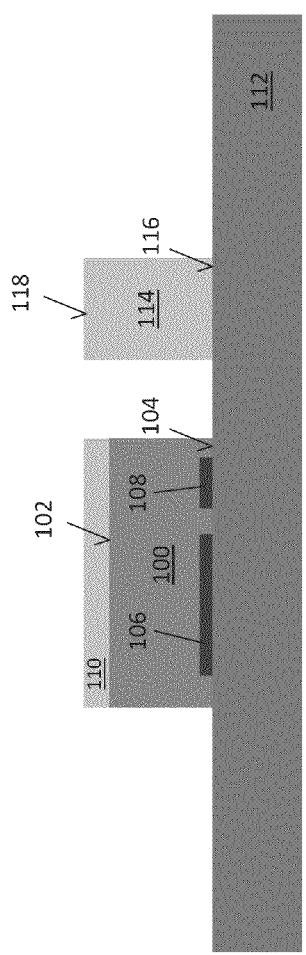
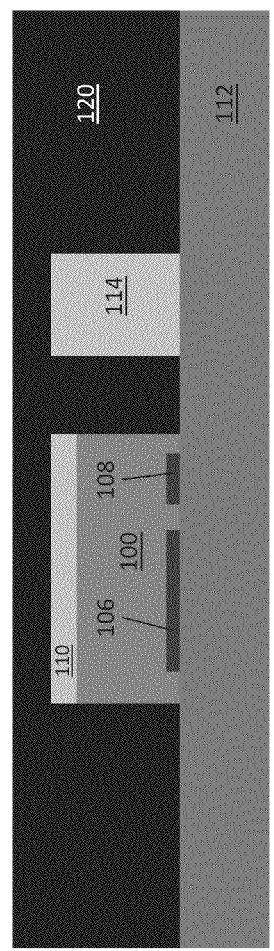
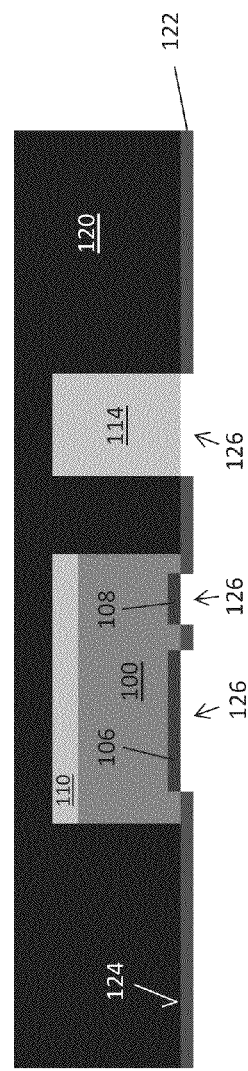

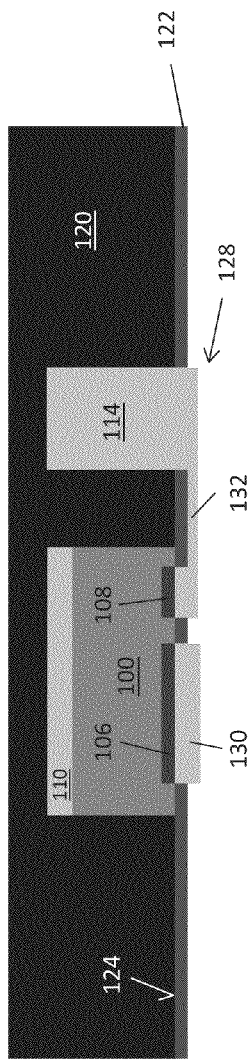
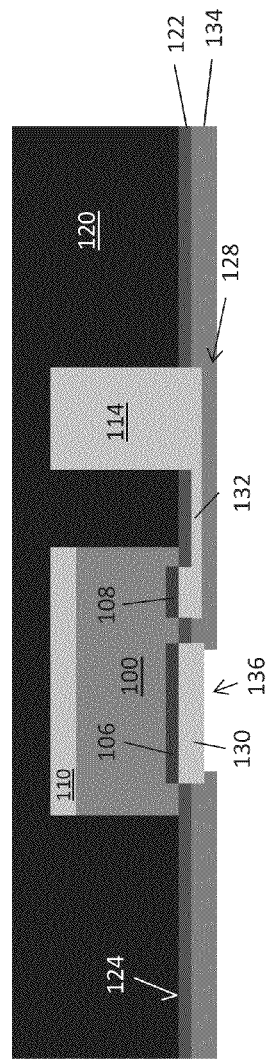
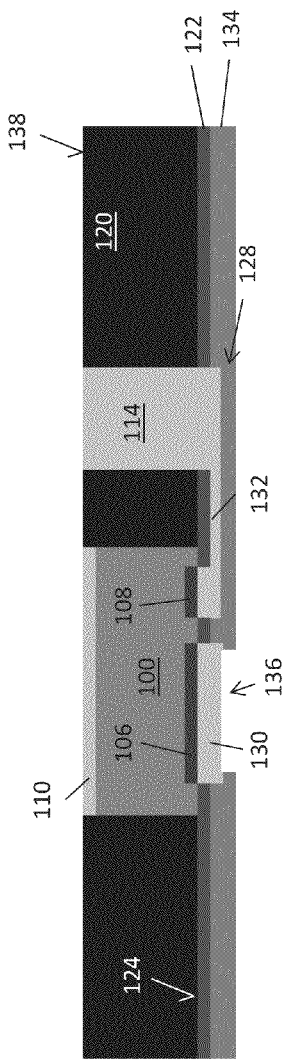
Figure 2D
Figure 2E
Figure 2F

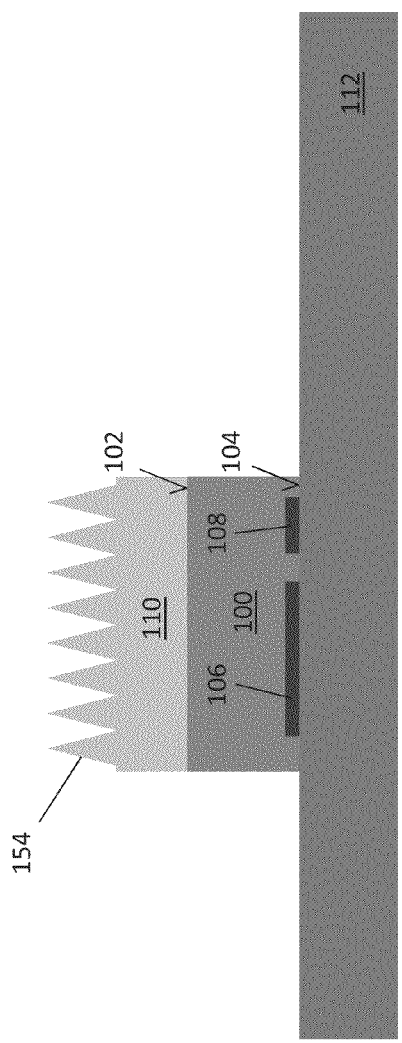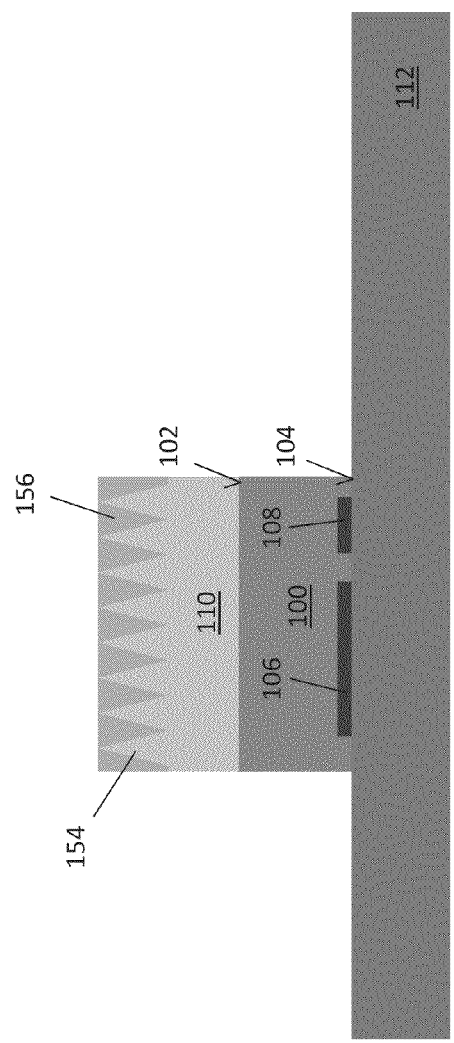
Figure 4A
Figure 4B

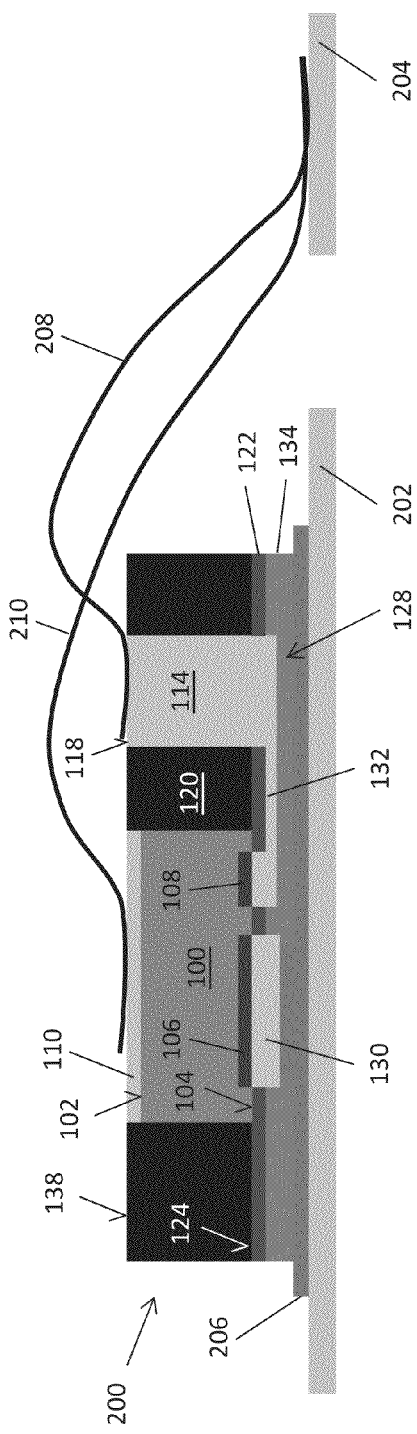
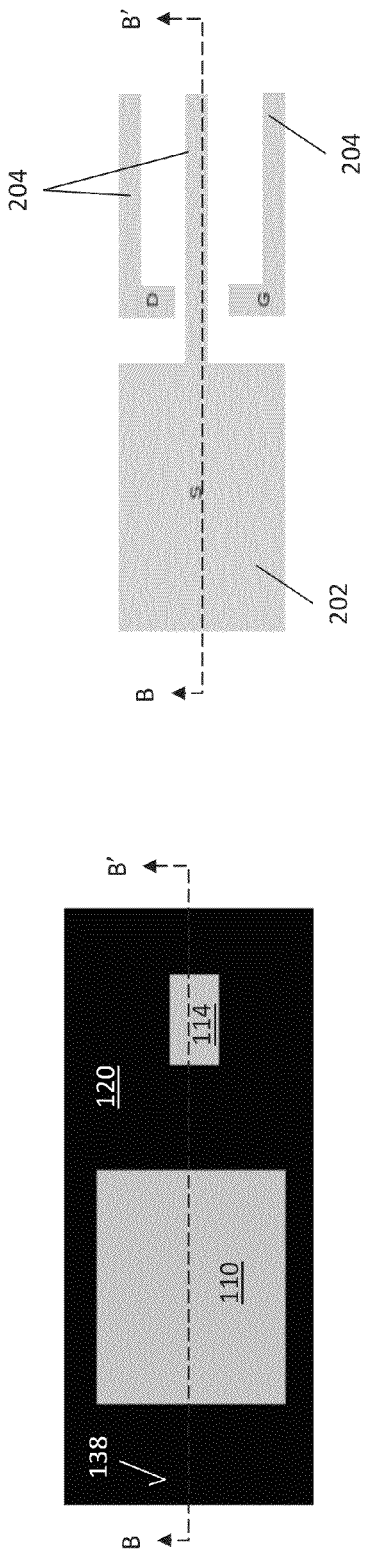
Figure 7A
Figure 7B
Figure 7C

MOLDED SEMICONDUCTOR PACKAGE WITH BACKSIDE DIE METALLIZATION

TECHNICAL FIELD

The present application relates to packaging of integrated circuits, in particular molded integrated circuit packages.

BACKGROUND

Embedded wafer level ball grid array (eWLB) is a packaging technology for integrated circuits (ICs) where package interconnects are applied on an artificial wafer or carrier made of individual semiconductor dies (chips) and a molding compound. The semiconductor dies are embedded (overmolded) in the molding compound. A redistribution layer is applied to a side of the eWLB wafer at which the pads of the dies are available. Electrical connections are formed between the die pads and the redistribution layer. Solder bumps are provided on the redistribution layer to enable package mounting after sawing of the eWLB wafer into individual IC packages.

Many types of semiconductor dies require contact at the front and back sides of the die e.g. to provide heat dissipation and/or electrical connectivity (in the case of vertical devices). Conventionally, backside metallization is applied to dies embedded in an eWLB-type package after molding of the dies. The backside metallization processing is done using the final artificial wafer thickness, which can result in warpage issues. For backside heat sinks, another conventional approach is to use a different package technology for connecting the heat sink to the backside of the embedded dies which adds to the overall cost. For other types of semiconductor dies such as acoustic or pressure sensors, light emitters and light sensors, etc., a material is provided at the backside of the dies to provide the necessary coupling (acoustic coupling, optical coupling, pressure coupling, etc.). Conventional approaches for these types of embedded dies involve applying the backside material after the die molding process or by using an additional package technology, again resulting in warpage issues and/or higher unit package cost.

SUMMARY

According to an embodiment of a method of manufacturing a semiconductor package, the method comprises: providing a semiconductor die with a terminal at a first side of the die; providing a material coupled to the die at a second side of the die opposing the first side; embedding the die in a molding compound so that the die is covered by the molding compound on all sides except the first side; thinning the molding compound at a side of the molding compound adjacent the second side of the die, to expose the material at the second side of the die without exposing the second side of the die; and forming an electrical connection to the terminal at the first side of the die.

According to an embodiment of a semiconductor package, the package comprises a semiconductor die having a first side and a second side opposing the first side, a terminal at the first side of the die, a material coupled to the die at the second side of the die, and a molding compound in which the die is embedded so that the die is covered by the molding compound on all sides except the first side and the material at the second side of the die is exposed without the second side of the die being exposed. The semiconductor package further comprises an electrical connection to the terminal at the first side of the die.

In the case of a transistor die, the terminal can be a source terminal and the transistor die can be attached source-down to a metal block such as a die paddle of a lead frame.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A through 2I illustrate respective cross-sectional views of a molded semiconductor package during different stages of a method of manufacturing the semiconductor package, according to an embodiment.

FIGS. 4A through 4F illustrate respective cross-sectional views of a molded semiconductor package during different stages of a method of manufacturing the semiconductor package, according to another embodiment.

FIGS. 7A through 7C illustrate different views of a molded semiconductor package attached to a die paddle and leads of a lead frame, according to an embodiment.

DETAILED DESCRIPTION

The embodiments described herein provide an embedded die packaging technology where the embedded dies are provided with a backside material prior to embedding in a molding compound. The material can be electrically coupled, thermally coupled, acoustically coupled, optically coupled, pressure coupled, etc. to the die at the backside. The redistribution processes of the embedded die packaging technology described herein such as metallization and solder processes are performed using a thick artificial (carrier) substrate to avoid warpage issues. Afterward, the material at the backside of the dies is exposed by grinding or other thinning of the molding compound to avoid handling of thin artificial (carrier) wafers. In some cases, the embedded dies may have more than one terminal at the front side of the dies. For these cases, a metal block or other through mold via technologies can be embedded in the molding compound for bringing the electrical connection from one side of the molding compound to the other side of the molding compound.

Figure 1C:
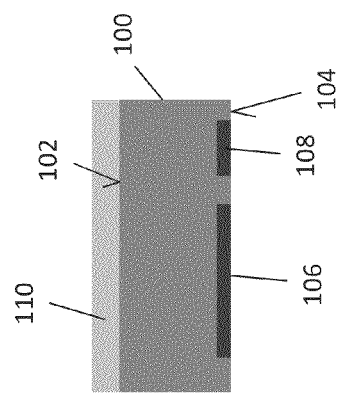
FIGS. 1A through 1C illustrate different views of a semiconductor die prior to embedding in a molding compound.
Figure 1A:
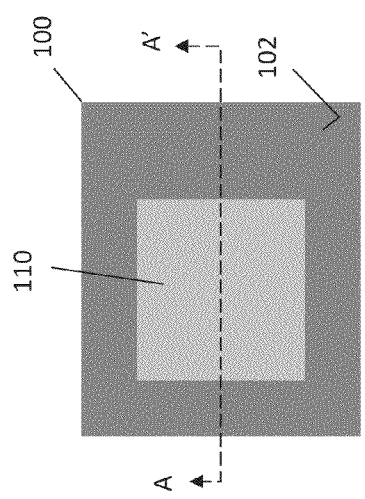
Figure 1B:
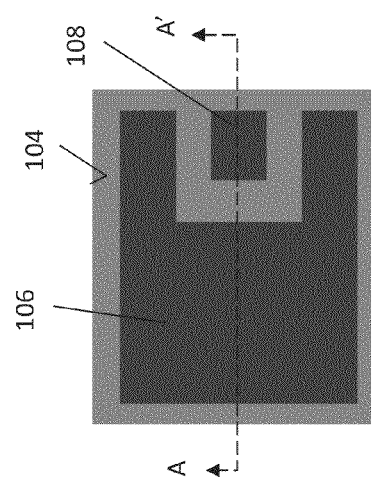
Figure 10:
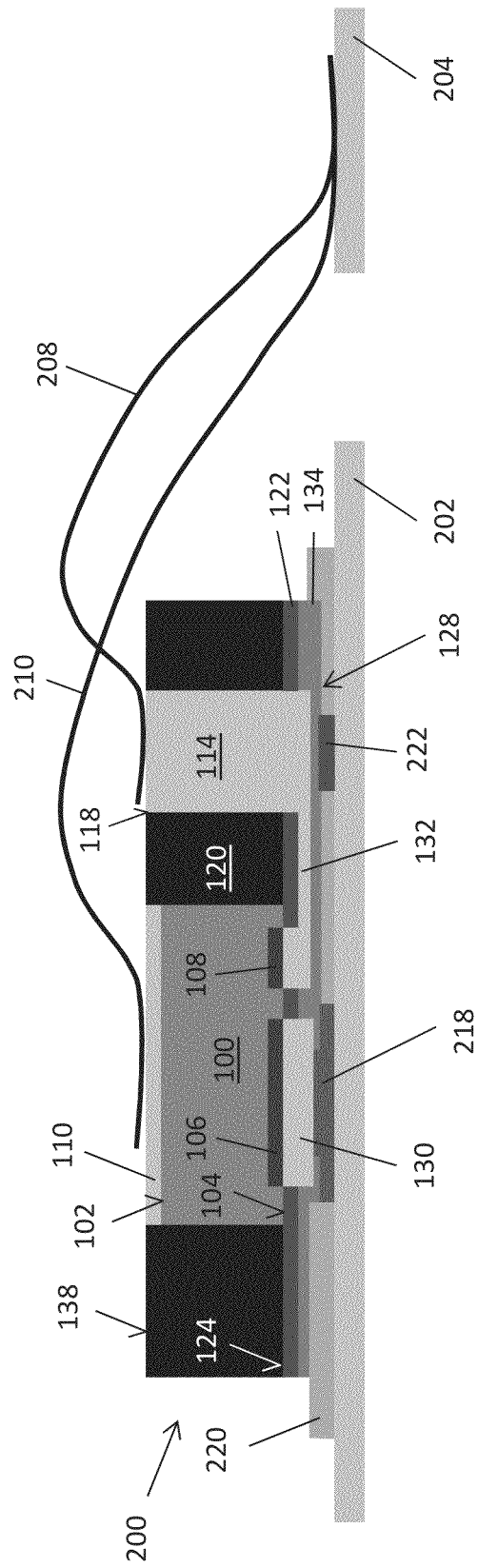
FIG. 10 illustrates a cross-sectional view of a molded semiconductor package attached to a die paddle and leads of a lead frame, according to still another embodiment.

FIG. 1, which includes FIGS. 1A through 1C, illustrates different views of a semiconductor die 100 prior to embedding in a molding compound. FIG. 1A shows a plan view of the backside 102 of the die 100, FIG. 1B shows a plan view of the front side 104 of the die 100, and FIG. 10 shows a cross-sectional view of the die 100 along the line labeled A-A' in FIGS. 1A and 1B. The semiconductor die 100 includes one or more terminals 106, 108 at the front side 104. For example in the case of a transistor die, at least a source terminal 106 and a gate terminal 108 can be disposed at the front side 104 of the die 100. The terminal(s) 106, 108 can be in the form of a bond pad or any other type of terminal structure conventionally provided with semiconductor dies.

The semiconductor die 100 also includes a material 110 provided at the backside 102 of the die 100 which is coupled to the die 100. The type of coupling between the backside material 110 and the die 100 depends on the type of die 100. In the case of electrical coupling, the material 110 is an electrically conductive material electrically coupled to the die 100 at the backside 102 of the die 100. In another embodiment, the material 110 is a thermally conductive material thermally coupled to the die 100 at the backside 102 of the die 100. For example, a structured or unstructured copper metal layer can be formed on the backside 102 of the die 100 for thermal and/or electrical coupling to the die 100. In yet another embodiment, the material 110 is an acoustically conductive material acoustically coupled to the die 100 at the backside 102 of the die 100.

The material 110 coupled to the die 100 can be formed on the backside 102 of the die 100 before or after placement on a carrier substrate. For example, a structured or unstructured copper metal layer can be formed on the backside 102 of the die 100 for thermal and/or electrical coupling to the die 100. In one embodiment, the copper metal layer can be plated on the backside 102 of the die 100 during die wafer level processing using standard wafer-level copper plating processes. In another embodiment, the copper metal layer can be bonded or glued to the backside 102 of the die 100 after the die 100 is placed on the carrier substrate. In each case, the material 110 is provided at the backside 102 of the die 100 before molding of the die 100.

Figure 2G:
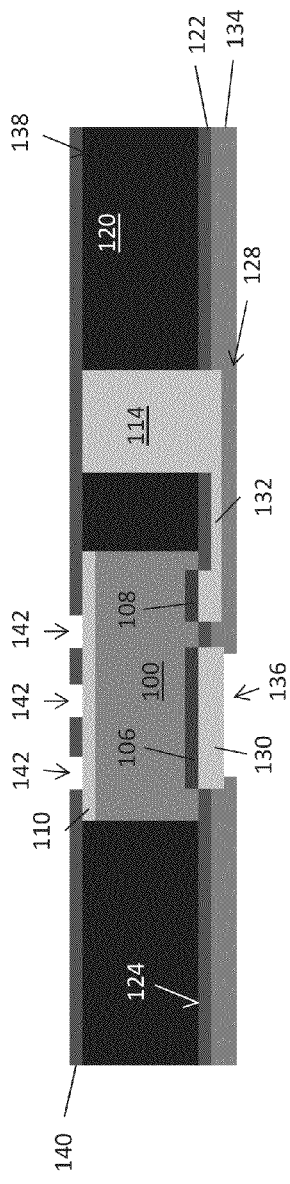

FIGS. 2A through 2I illustrate an embodiment of a method of manufacturing a semiconductor package including the semiconductor die 100 shown in FIGS. 1A through 1C. A plurality of similar dies 100 are processed at the same time, and separated into individual molded packages upon completion of the package processing. FIG. 2A shows the structure after a plurality of the dies 100 are placed on a thick artificial (carrier) substrate 112, with only one of the dies 110 shown in FIGS. 2A through 2I for ease of illustration. The front side 104 of each die 100 faces the carrier substrate 112. An optional metal block 114 is placed adjacent each die 100 on the carrier substrate 112. Each metal block 114 is spaced apart from the adjacent die 110, and has a first side 116 facing the same direction as the front side 104 of the dies 100 and an opposing second side 118 facing the same direction as the backside 102 of the dies 100.

FIG. 2B shows the structure after the dies 100 and the optional metal blocks 114 are embedded in a molding compound 120. Any standard molding compound can be used such as the kind employed in conventional eWLB technology. For example, liquid or solid molding compounds can be used. In each case, the dies 100 and optional metal blocks 114 are covered by the molding compound 120 on all sides except the side 104, 116 covered by the substrate 112.

FIG. 2C shows the structure after the carrier substrate 112 is removed and an optional first insulation layer 122 is provided on the side 124 of the molding compound 120 adjacent the front side 104 of the dies 100. The first insulation layer 122 can be a polymeric material such as polyimide, WPR (a phenol-melamine-based novolac resin material), etc. Openings 126 are formed in the first insulation layer 122 to expose the terminals 106, 108 at the front side 104 of the dies 100 and optionally the side 116 of the metal block 114 facing the same direction as the front side 104 of the dies 100.

FIG. 2D shows the structure after a structured metal redistribution layer 128 such as a structured copper layer is formed at the side 124 of the molding compound 120 adjacent the front side 104 of the dies 100 e.g. on the optional first insulation layer 122 if provided. In cases where the first insulation layer 122 is omitted, the structured metal redistribution layer 128 is formed directly on the backside 124 of the molding compound 120 and the uncovered side 104, 116 of the dies 100 and optional metal blocks 114. The redistribution layer 128 allows for redistribution of electrical connections to the terminals 106, 108 at the front side 104 of the dies 100. The structured metal redistribution layer 128 has a first part 130 attached to one terminal of each die 100 (e.g. the source terminal 106 of a transistor die) and a second part 132 attached to a second terminal of each die 100 (e.g. the gate terminal 108 of a transistor die). The first and second parts 130, 132 of the structured metal redistribution layer 128 are disconnected from each other to ensure proper operation of the dies 100.

FIG. 2E shows the structure after a second insulation layer 134 is formed on the side of the structured metal redistribution layer 128 facing away from the dies 100. An opening 136 is formed in the second insulation layer 134 over each first part 130 of the structured metal layer 128. The second insulation layer 134 covers each second part 132 of the structured metal layer 128. The second insulation layer 134 can be any dielectric material suitable as a solder-stop material (for subsequent solder ball processing) and/or electrical isolation material (for subsequent bonding of the redistribution layer 128 e.g. to a die paddle of a lead frame).

FIG. 2F shows the structure after the molding compound 120 is thinned at the side 138 of the molding compound 120 adjacent the backside side 102 of the dies 100. The molding compound 120 is thinned to expose the material 110 at the backside side 102 of the dies 100 without exposing the backside side 102 of the dies 100. Any suitable thinning process can be used such as etching or mechanical grinding. For example in the case of mechanical grinding, the material 110 at the backside 102 of the dies 100 can be detected by optical or visual inspection, by a change in the grinding speed owing to a material density difference between the molding compound and the die backside material, by an auditory noise resulting from the grinding mechanism contacting the die backside material, etc. The molding compound 120 can be over-thinned i.e. the thinning process continues after the exposure of the material 110 at the backside 102 of the dies 100 is detected. In one embodiment, the material 110 at the backside 102 of the dies 100 contains copper and is at least 10 µm thick to ensure the backside side 102 of the dies 100 is not exposed during the molding compound thinning process which can involve removal of some of the die backside material 110. In one embodiment, the side 118 of the optional metal blocks 114 adjacent the backside 102 of the dies 100 is covered by the molding compound 120 prior to the thinning of the molding compound 120 as shown in FIG. 2E and exposed after the thinning of the molding compound 120 as shown in FIG. 2F. Such a device can already be used at this point for some applications.

Figure 2H:
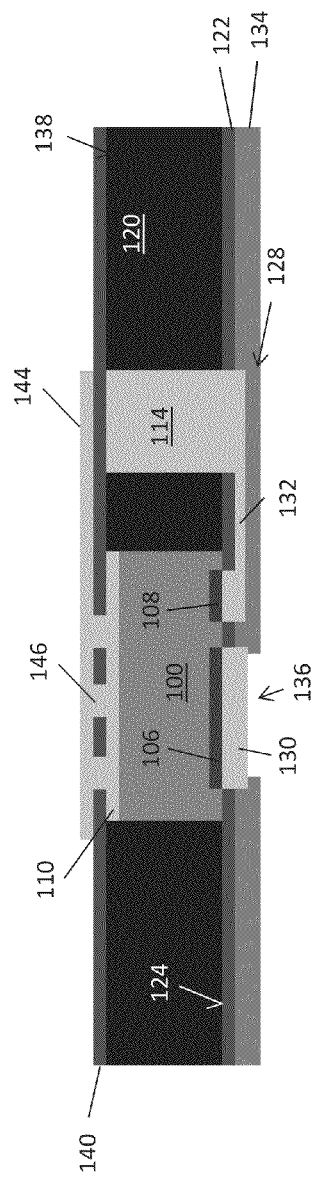
Figure 2I:
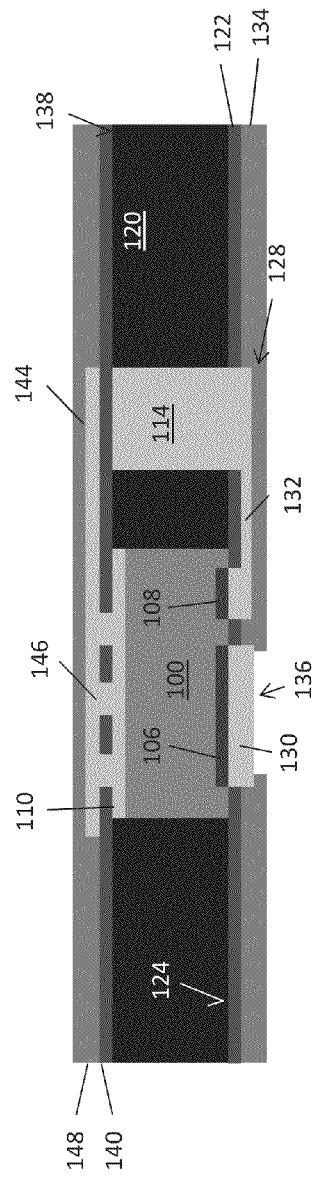

The processing shown in FIGS. 2G through 2I is optional if a redistribution on the backside is desired and can be employed for semiconductor dies 100 in which the material 110 at the backside 102 of the dies 100 is electrically coupled to the respective dies 100. In one embodiment, the backside material 110 forms a terminal of the dies 100 such as a drain terminal of a vertical transistor die where the terminals 106, 108 at the front side 104 of the dies are source and gate terminals, respectively.

FIG. 2G shows the structure after a third insulation layer 140 is formed on the thinned side 138 of the molding compound 120. The third insulation layer 140 can be a polymeric material such as polyimide, WPR (a phenol-melamine-based novolac resin material), etc. Openings 142 are formed in the third insulation layer 140 to expose part of the material 110 at the backside 102 of the dies 100, and to expose part of the side 118 of the optional metal blocks 114 if provided. Openings in the third insulation layer 140 over the metal blocks 114 are out of view in FIG. 2G.

FIG. 2H shows the structure after a metal layer 144 such as a copper redistribution layer is formed on the third insulation layer 140 with the openings 142. If the optional metal blocks 114 are provided, the metal layer 144 can be structured so that the metal layer 144 has a first part 146 and a second part (out of view) disconnected from the first part 146. The first part 146 of the metal layer 144 contacts the material 110 at the backside 102 of the dies 100 through the corresponding openings 142 in the third insulation layer 140. The second part of the metal layer 144 contacts the metal blocks 114 through corresponding openings in the third insulation layer 140 (these openings and contacts are out of view in FIG. 2H).

FIG. 2I shows the structure after a fourth insulation layer 148 is formed on the metal layer 144 at the thinned side 138 of the molding compound 120. In one embodiment, the fourth insulation layer 148 is a passivation layer. Electrical connections can be made to the metal layer 144 through openings (not shown) formed in the fourth insulation layer 148, or by lateral extension of the metal layer 144 to the edge of the individual packages (separation of the individual packages is not shown in FIG. 2I).

Figure 3B:
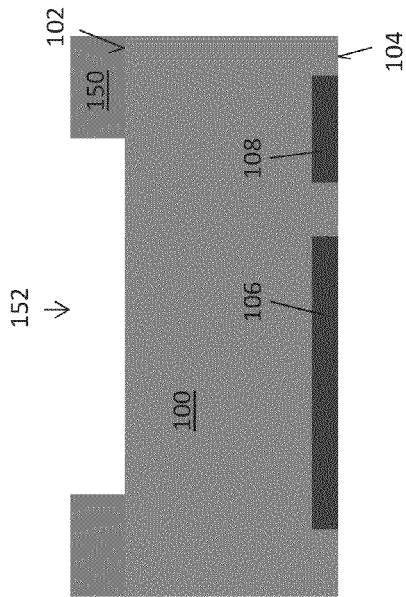
FIGS. 3A through 3C illustrate respective cross-sectional views of a semiconductor die having a material provided at the backside of the die prior to embedding in a molding compound.
Figure 3C:
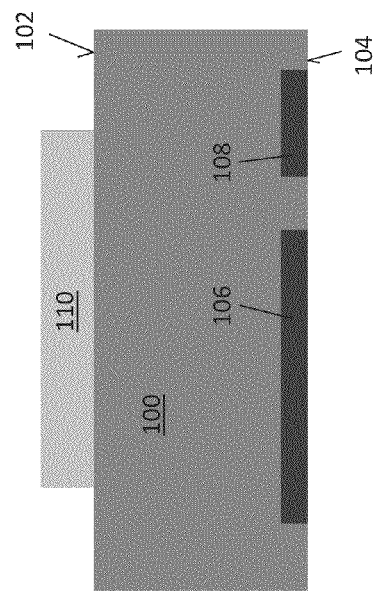
Figure 3A:
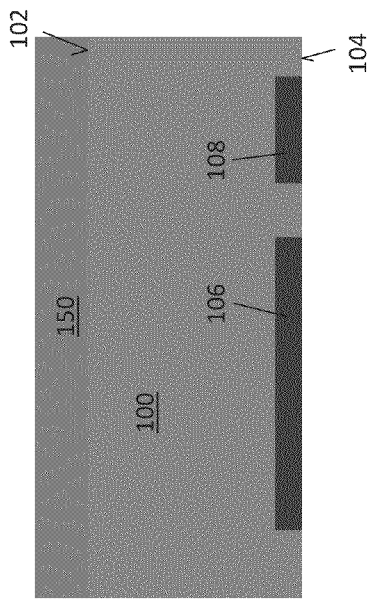

FIGS. 3A through 3C illustrate cross-sectional views of the semiconductor die 100 during different stages of forming the material 110 at the backside 102 of the die 100 prior to placement on the carrier substrate 112, according to an embodiment. FIG. 3A shows the die 100 after an insulation layer 150 such as a resist, imide, etc. is formed on the backside 102 of the die 100. FIG. 3B shows the die 100 after an opening 152 is formed in the insulation layer 150 that exposes part of the backside 102 of the die 100. FIG. 3C shows the die 100 after a copper-containing material 110 is formed in the opening 152 in the insulation layer 150 e.g. by plating or deposition. According to this embodiment, the material 110 is directly attached to the backside 102 of the die 100 prior to placement on the carrier substrate 112.

Figure 4C:
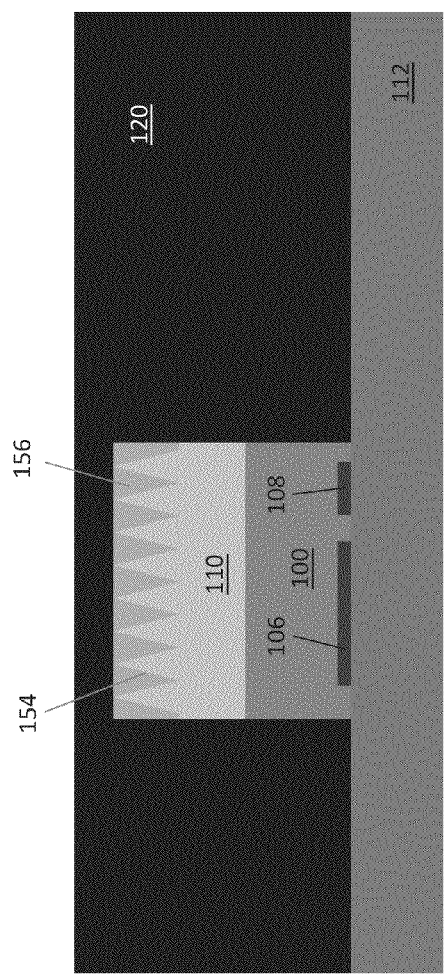

FIGS. 4A through 4F illustrate another embodiment of a method of manufacturing a semiconductor package including semiconductor dies embedded in a molding compound. FIG. 4A shows the structure after a plurality of dies 100 are placed on a carrier substrate 112, with only one of the dies 100 shown in FIGS. 4A through 4F for ease of illustration. The front side 104 of the dies 100, at which the die terminals 106, 108 are disposed, faces the carrier substrate 112. According to this embodiment, the material 110 at the backside 102 of the dies 100 is a thermally conductive material thermally coupled to the respective dies 100 at the backside 102 of the dies 100. The thermally conductive material 110 has fin structures 154 extending away from the backside 102 of the corresponding die 100. In one embodiment, the thermally conductive material 110 is a copper block with fins 154. The copper block 110 can be plated on the backside 102 of the respective dies 100 prior to placement on the carrier substrate 112 or bonded to the backside 102 of the respective dies 100 after placement on the carrier substrate 112 as previously described herein. In either case, the thermally conductive material 110 is provided at the backside 102 of the respective dies 100 prior to the dies 100 being embedded in a molding compound.

FIG. 4B shows the structure after the fin structures 154 are covered with a glob top material 156. A glob top is a specially formulated resin deposited over the dies 100 to provide mechanical support and exclude contaminants which could disrupt circuit operation. Any commercially available glob top material can be used.

FIG. 4C shows the structure after the dies 100 are embedded in a molding compound 120 so that all sides of the dies 100 are covered by the molding compound 120 except the side covered by the carrier substrate 112. The fin structures 154 of the thermally conductive material 110 at the backside 102 of the dies 100 remains covered with the glob top material 156 during formation of the mold compound 120.

Figure 4D:
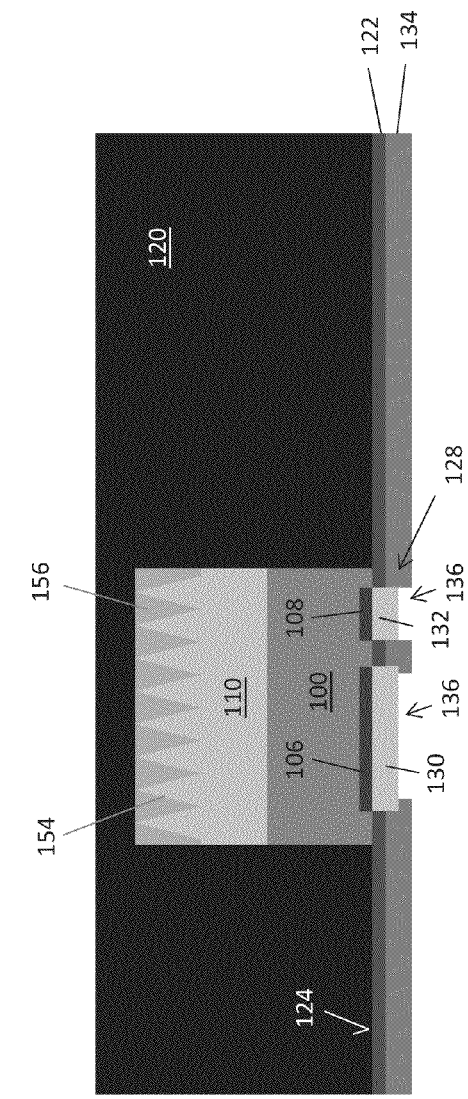

FIG. 4D shows the structure after a structured metal redistribution layer 128 such as a structured copper layer is formed at the side 124 of the molding compound 120 adjacent the front side 104 of the dies 100 e.g. in accordance with FIGS. 2C through 2E and as previously described herein.

Figure 4E:
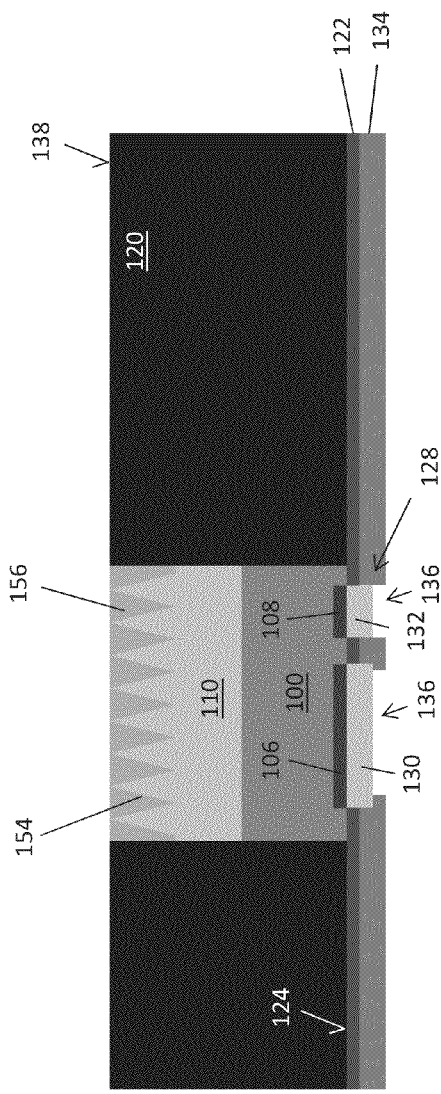

FIG. 4E shows the structure after the molding compound 120 is thinned at the side 138 of the molding compound 120 adjacent the backside 102 of the dies 100, to expose the glob-top-covered thermally conductive material 110 at the backside 102 of the dies 100 without exposing the backside side 102 of the dies 100 e.g. in accordance with FIG. 2F and as previously described herein.

Figure 4F:
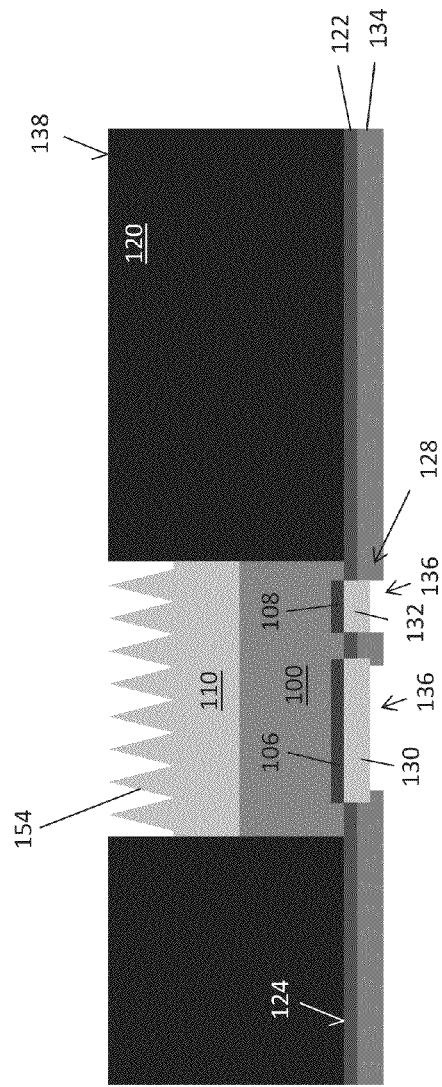

FIG. 4F shows the structure after the glob top material 156 is removed from the thermally conductive material 110 at the backside 102 of the dies 100, after thinning of the molding compound 120. The glob top material 156 can be removed using any standard solvent that does not attack the molding compound 120.

Figure 5:
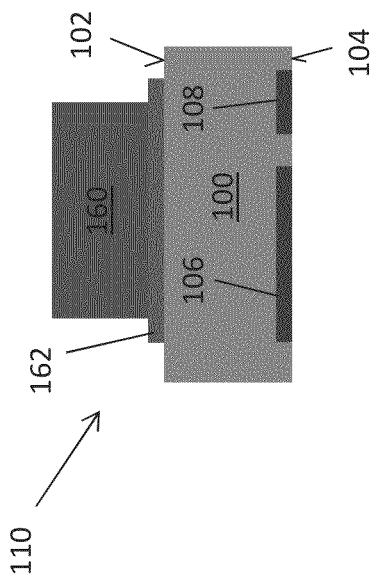
FIG. 5 illustrates a cross-sectional view of a semiconductor die prior to embedding in a molding compound, according to another embodiment.

FIG. 5 illustrates a cross-sectional view of yet another embodiment of the semiconductor die 100 to be embedded in a molding compound according to the embedded packing technology described herein. In one embodiment, the die 100 is operable to emit or sense light at the backside 102 of the die 100 (e.g. in the case of an LED or photodiode). According to this embodiment, the material 110 at the backside 102 of the die 100 is a translucent material 160 such as a glass block attached to the backside 102 of the die 100 by an adhesive 162 and optically coupled to the die 100, so that the die 100 can detect or emit light through the translucent material 160. In another embodiment, the die 100 is a pressure sensor or microphone die and the material 160 allows pressure or sound to go through the material 160 and reach the die 100.

Figure 6:
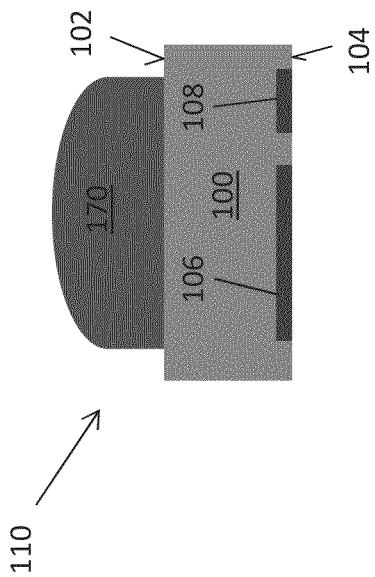
FIG. 6 illustrates a cross-sectional view of a semiconductor die prior to embedding in a molding compound, according to yet another embodiment.

FIG. 6 illustrates a cross-sectional view of still another embodiment of the semiconductor die 100 to be embedded in a molding compound according to the embedded packing technology described herein. In one embodiment, the die 100 contains a pressure sensor which senses pressure at the backside 102 of the die 100. The material 110 at the backside 102 of the die 100 is a compressible glob top material 170 according to this embodiment, enabling the pressure sensor to sense pressure. In another embodiment, the die 100 is an LED or photodiode die and the glob top material 170 is translucent.

In some case, the dies embedded in a molding compound according to the embedded packing technology described herein are vertical transistor dies in that current flows through the semiconductor material between the front and back sides of the dies. For example referring to FIGS. 1A through 1C, the source and gate terminals of the transistor are disposed at the front side of the dies and the drain terminal is disposed at the backside of the dies. The term 'source terminal' as used herein refers to the source terminal of an FET (field effect transistor) such as a MOSFET (metal oxide semiconductor FET) or GaN HEMT (high electron mobility transistor), or the emitter terminal of a bipolar transistor such as an IGBT (insulated gate bipolar transistor). Likewise, the term 'drain terminal' as used herein refers to the drain terminal of an FET or the collector terminal of a bipolar transistor.

FIGS. 7A through 7C illustrate different views of a semiconductor package 200 after attachment to a die paddle 202 and leads 204 of a lead frame. FIG. 7A shows a cross-sectional view of the semiconductor package 200 along the line labelled B-B' in FIGS. 7B and 7C, FIG. 7B is a top plan view of the package 200, and FIG. 7C is a top plan view of the die paddle 202 and leads 204 of the lead frame. The semiconductor package 200 corresponds to the package produced according to the embedded packing method illustrated in FIGS. 2A through 2F.

The semiconductor die 100 is a vertical transistor die according to this embodiment, having a source (S) terminal 106 and a gate (G) terminal 108 at the front side 104 of the die 100 facing the die paddle 202 and a drain (D) terminal formed by the material 110 at the backside 102 of the die 100. The material 110 at the backside of the die 100 is electrically conductive according to this embodiment, e.g. such as a copper layer. The source terminal 106 of the transistor die 100 is attached to the die paddle 202 of the lead frame at a side of the source terminal 106 facing away from the die 100 by electrically conductive glue 206 according to this embodiment. The electrically conductive glue 206 fills the opening 136 formed in insulation layer 134 shown in FIG. 4D. The electrically conductive glue 206 can be used as an underfill if desired. The insulation layer 134 electrically insulates the die paddle 202 from the gate terminal 108 of the transistor die 100.

The second part 132 of the structured metal redistribution layer 128 of the package 200 provides an electrical connection between the metal block 114 and the gate terminal 108 at the front side 104 of the transistor die 100. The opposing side 118 of the metal block 114 is connected to the gate G lead 204 of the lead frame by one or more bond wires, ribbons, a metal clip, or other type of electrical conductor 208. The drain terminal formed by the material 110 at the backside 102 of the die 100 is similarly connected to the drain D lead 204 of the lead frame by one or more bond wires, ribbons, a metal clip, or other type of electrical conductor 210 at a side of the electrically conductive material 110 facing away from the die 100.

Figure 8:
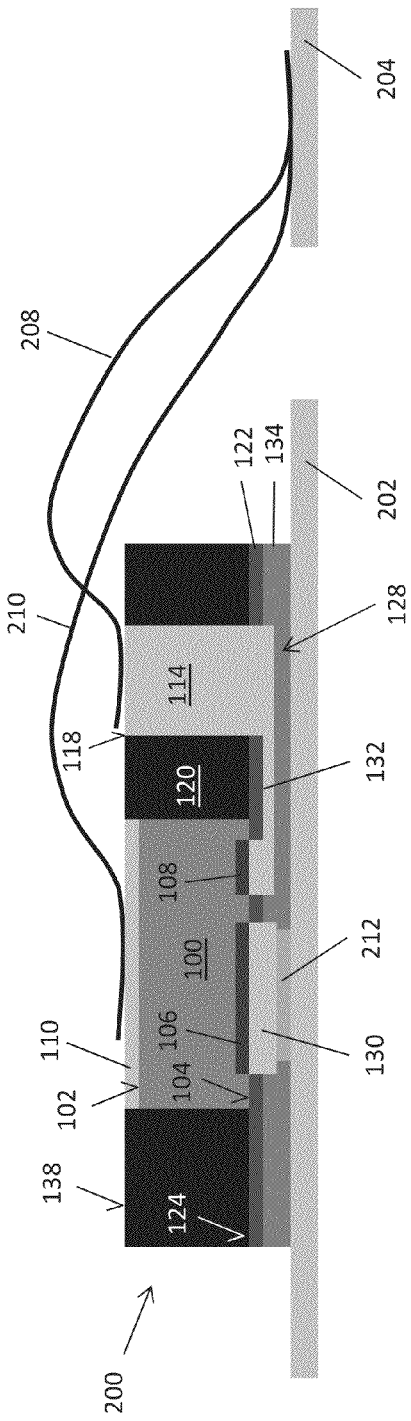
FIG. 8 illustrates a cross-sectional view of a molded semiconductor package attached to a die paddle and leads of a lead frame, according to another embodiment.

FIG. 8 illustrates a cross-sectional view of the semiconductor package 200 according to another embodiment. The embodiment shown in FIG. 8 is similar to the embodiment shown in FIG. 7A, however, solder 212 fills the opening 136 formed in insulation layer 134 shown in FIG. 4D and electrically connects the source terminal 106 of the transistor die 100 to the die paddle 202 of the lead frame according to this embodiment.

Figure 9:
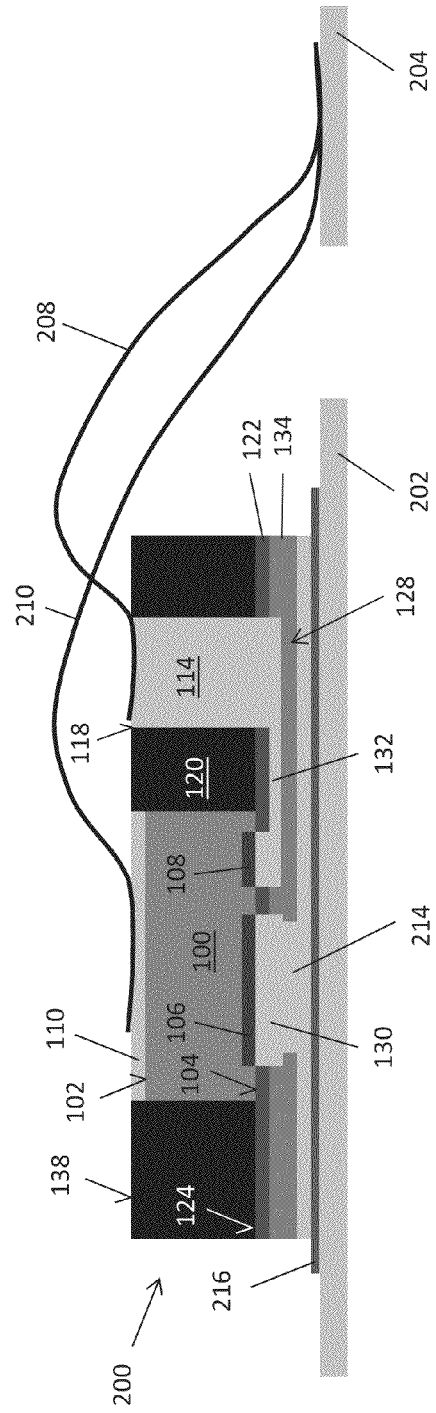
FIG. 9 illustrates a cross-sectional view of a molded semiconductor package attached to a die paddle and leads of a lead frame, according to yet another embodiment.

FIG. 9 illustrates a cross-sectional view of the semiconductor package 200 according to yet another embodiment. The embodiment shown in FIG. 9 is similar to the embodiment shown in FIG. 7A, however, an additional metal layer 214 such as a second copper redistribution layer is provided that fills the opening 136 formed in insulation layer 134 shown in FIG. 4D. The additional metal layer 214 can cover the entire front side 104 of the transistor die 100. The additional metal layer 214 can partially or completely cover the side of the insulation layer 134 facing away from the structured copper metal layer 128. For example in the case of an unstructured copper redistribution layer, the additional metal layer 214 completely covers the side of the insulation layer 134 facing away from the structured copper metal layer 128. The additional metal layer 214 can be attached to the die paddle 202 e.g. by solder 216. The additional metal layer 214 is interposed between insulation layer 134 and the die paddle 202, contacts the die paddle 202 at one side of the additional metal layer 214, and contacts the first part 130 of the structured metal layer 128 through the opening 136 in insulation layer 134. The additional metal layer 214 is spaced apart from the second part 132 of the structured metal layer 128 by insulation layer 134.

FIG. 10 illustrates a cross-sectional view of the semiconductor package 200 according to still another embodiment. The embodiment shown in FIG. 10 is similar to the embodiment shown in FIG. 7A, however, solder or a conductive glue 218 fills the opening 136 formed in insulation layer 134 shown in FIG. 4D and electrically connects the source terminal 106 of the transistor die 100 to the die paddle 202 of the lead frame. The solder/conductive glue 218 also acts as a partial underfill according to this embodiment, as indicated by the lateral extension of the solder/conductive glue 218 onto the side of insulation layer 134 facing the die paddle 202. Additional molding compound or other suitable non-conductive material 220 can be provided to complete the underfill under the package 200. A support pad 222 can be embedded in the additional molding compound 220 to prevent tilting of the package 200 during solder wetting in the case of solder 218 being used to fill the opening 136 formed in insulation layer 134.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor package, comprising:
   a semiconductor die having a first side and a second side opposing the first side;
   a terminal at the first side of the die;
   a material coupled to the die at the second side of the die;
   a molding compound in which the die is embedded, the die being covered by molding compound on all sides except the first side and the second side, the material at the second side of the die being uncovered by molding compound without the second side of the die being exposed; and an electrical connection to the terminal at the first side of the die.

2. The semiconductor package of claim 1, wherein the material at the second side of the die is an electrically conductive material electrically coupled to the die at the second side of the die, the semiconductor package further comprising a lead electrically connected to the electrically conductive material at a side of the electrically conductive material facing away from the die.

3. The semiconductor package of claim 1, wherein the material at the second side of the die is a thermally conductive material thermally coupled to the die at the second side of the die.

4. The semiconductor package of claim 3, wherein the thermally conductive material has fin structures extending away from the second side of the die.

5. The semiconductor package of claim 1, wherein the material at the second side of the die is an acoustically conductive material acoustically coupled to the die at the second side of the die.

6. The semiconductor package of claim 1, wherein the die is operable to emit or sense light and the material at the second side of the die is a translucent material optically coupled to the die at the second side of the die.

7. The semiconductor package of claim 1, wherein the material at the second side of the die is a glob top material.

8. The semiconductor package of claim 1, wherein the material at the second side of the die contains copper and is at least 10 μm thick.

9. The semiconductor package of claim 1, further comprising a metal block embedded in the molding compound and spaced apart from the die by part of the molding compound, the metal block having a first side facing the same direction as the first side of the die and uncovered by the molding compound and an opposing second side facing the same direction as the second side of the die.

10. The semiconductor package of claim 9, further comprising an electrical connection between the first side of the metal block and an additional terminal disposed at the first side of the die.

11. The semiconductor package of claim 10, further comprising a lead electrically connected to the second side of the metal block.

12. The semiconductor package of claim 1, further comprising:

an insulation layer on the side of the molding compound adjacent the second side of the die; and an opening in the insulation layer over at least part of the second side of the die, wherein the material at the second side of the die is a copper-containing material disposed in the opening in the insulation layer.

13. The semiconductor package of claim 1, further comprising:

an insulation layer on the thinned side of the molding compound, the insulation layer having one or more openings over part of the material at the second side of the die; and a metal layer on the insulation layer, the metal layer contacting the material at the second side of the die through the one or more openings in the insulation layer.

14. The semiconductor package of claim 1, wherein the die is a transistor die, the terminal at the first side of the die is a source terminal of the transistor die and the material at the second side of the die forms a drain terminal of the transistor die.

15. The semiconductor package of claim 14, further comprising a die paddle of a lead frame, wherein the source terminal of the transistor die is attached to the die paddle at a side of the source terminal facing away from the transistor die.

16. The semiconductor package of claim 14, wherein the transistor die has a gate terminal at the first side of the die and spaced apart from the source terminal.

17. The semiconductor package of claim 16, further comprising:

a metal block embedded in the molding compound and spaced apart from the die by part of the molding compound, the metal block having a first side facing the same direction as the first side of the transistor die and uncovered by the molding compound and an opposing second side facing the same direction as the second side of the transistor die; and an electrical connection between the first side of the metal block and the gate terminal at the first side of the transistor die.

18. The semiconductor package of claim 16, further comprising:

a structured metal layer at a side of the molding compound adjacent the first side of the transistor die, the structured metal layer comprising a first part attached to the source terminal of the transistor die and a second part disconnected from the first part and attached to the gate terminal of the transistor die;

an insulation layer on a side of the structured metal layer facing away from the transistor die, the insulation layer having an opening over the first part of the structured metal layer and covering the second part of the structured metal layer; and a die paddle of a lead frame at a side of the insulation layer facing away from the structured copper metal layer, the die paddle being electrically connected to the source terminal of the transistor die through the opening in the insulation layer and electrically insulated from the gate terminal of the transistor die by the insulation layer.

19. The semiconductor package of claim 18, wherein the die paddle is attached to the first part of the structured metal layer by an electrically conductive material that fills the opening in the insulation layer.

20. The semiconductor package of claim 19, wherein the electrically conductive material covers the entire first side of the transistor die.

21. The semiconductor package of claim 18, further comprising an additional metal layer filling the opening in the insulation layer and at least partially covering the side of the insulation layer facing away from the structured copper metal layer, wherein the additional metal layer is interposed between the insulation layer and the die paddle, contacts the die paddle at one side of the additional metal layer, contacts the first part of the structured metal layer through the opening in the insulation layer, and is spaced apart from the second part of the structured metal layer by the insulation layer.

22. The semiconductor package of claim 21, wherein the additional metal layer covers the entire first side of the transistor die.

* * * * *